United States Patent [19]

Avicola

[11] 4,429,401
[45] Jan. 31, 1984

[54] MOLTEN-METAL LIQUID LEVEL SENSOR

[75] Inventor: Kenneth Avicola, Kingwood, Tex.

[73] Assignee: Jersey Nuclear-Avco Isotopes, Inc., Bellevue, Wash.

[21] Appl. No.: 327,633

[22] Filed: Dec. 4, 1981

[51] Int. Cl.³ .......................................... H01J 37/305
[52] U.S. Cl. ..................................................... 373/12
[58] Field of Search ..................... 373/11, 12, 14, 16; 250/492.2, 284, 288

[56] References Cited

U.S. PATENT DOCUMENTS

| | | |
|---|---|---|
| 3,390,249 | 6/1968 | Hanks ............................... 373/12 X |
| 3,441,348 | 4/1969 | Nichols et al. . |
| 3,510,195 | 5/1970 | Noble . |
| 3,513,704 | 5/1970 | Hatcher . |
| 3,519,332 | 7/1970 | Kaiser . |
| 3,531,185 | 9/1970 | Buchsbaum . |
| 3,588,891 | 6/1971 | Porter, Jr. . |
| 3,589,797 | 6/1971 | Miller . |
| 3,606,523 | 9/1971 | Taylor et al. . |
| 4,140,393 | 2/1979 | Cetas . |
| 4,262,160 | 4/1981 | McKoon et al. ..................... 373/11 |

*Primary Examiner*—Roy N. Envall, Jr.
*Attorney, Agent, or Firm*—Weingarten, Schurgin, Gagnebin & Hayes

[57] ABSTRACT

A level sensor for measurement of the level of molten metal in an electron beam evaporator which operates to sense directly the position of the point or line source of evaporant by detection of radiation such as light emitted therefrom. Compensation is provided for variations in electron beam deflecting magnetic field to avoid interpreting lateral movement of the point or line source from field variations as level changes. Compensation is also provided in the detection circuit for variations in detected light intensity that would otherwise provide an erroneous indication of level change. Detection of further conditions that produce unreliable level sensing and system inhibition in response thereto is provided as a safety feature.

13 Claims, 3 Drawing Figures

MOLTEN-METAL LIQUID LEVEL SENSOR

FIELD OF THE INVENTION

The present invention relates to level detection and in particular to apparatus for passively measuring the level of an electron beam melted metal pool.

BACKGROUND OF THE INVENTION

One process for uranium isotope separation requires a source of uranium vapor. This vapor can be supplied by an electron beam evaporator. U.S. Pat. No. 4,035,574 described such an evaporator. The uranium evaporation takes place within a vacuum chamber. During the evaporation process the activity within the chamber is quite violent and the environment inside the chamber is quite hostile. Temperatures sufficient to vaporize uranium exist within the chamber. Uranium liquid and vapor, both present, are extremely corrosive.

During the isotope separation process the pool of molten uranium from which the vapor originates becomes depleted. It is desirable to maintain the level of the pool within certain limits. Control over feeding of the uranium stock to replenish the pool can be performed manually. Manual control requires the operator to view the level of the pool through a window in the chamber. The visibility required for this control method is tenuous, due to splattering of the window and violent activity within the chamber. It is desirable to implement a level control system less sensitive to conditions in the chamber and not requiring manual intervention.

In order to implement such an automatic level control system, a means of measuring the level of the molten metal pool is required. One method has been to monitor the weight of the crucible. For this method force transducers are located inside the hostile environment of the chamber. As splattering may cause build up of metal outside the molten region, the level of the molten region of the pool can drop without being sensed as a weight change. Another method requires an active probe beam such as supplied by a helium-neon laser. The probe beam is reflected off the surface of the metal pool and picked up by a detector. The laser and detector can be located outside the chamber, but two optical ports into the chamber are required. During evaporation the violent activity makes reception of a reflected beam unreliable.

SUMMARY OF THE INVENTION

The present invention requires no active source or probe beam, but instead responds directly to light which is emitted from the area of impact of an electron beam on the surface of a pool of molten metal. In the present invention this light is imaged onto a position sensitive photodetector. The photodetector and optical system are positioned such that as the level of the pool changes, the position of the light imaged on the photodetector also moves. The output of the photodetector is proportional to the position of the spot on the photodetector and therefore is also related to the level of the pool of molten metal.

The photodetector output thus produced is generally prone to errors from two sources and thus difficult to use directly. It is accordingly corrected in two ways. The difference output of the photodetector is sensitive to both spot position and spot intensity. The difference output is divided by the sum output of the detector (sensitive to intensity only) to obtain a position sensitive signal independent of spot intensity. Changes in position of the electron beam used to melt and evaporate the metal will also result in changes in the position of the spot imaged on the detector. The electron beam position typically varies as a result of changes in the strength of the magnetic field which deflects and focuses the electron beam onto a line on the molten metal. A Hall effect device is used to measure the strength of this field. A signal from the Hall device is used to correct the image position signal for small changes in field strength, thereby correcting the level signal for changes in beam position.

The resulting signal from the corrected photodetector output will thus accurately reflect the level of the molten metal despite magnetic field variations or spot intensity changes.

Under the conditions of brief loss of the electron beam, resulting in large electron beam movements or low intensity of the image on the position detector, the level cannot be reliably determined. Detection of any of these conditions holds the position signal at its last value and produces a signal indicating that the level measurement is not being updated.

BRIEF DESCRIPTION OF THE DRAWING

These and other features of the present invention are more fully set forth below in the detailed description of the invention and the accompanying drawing of which.

DETAILED DESCRIPTION

Figure 1:
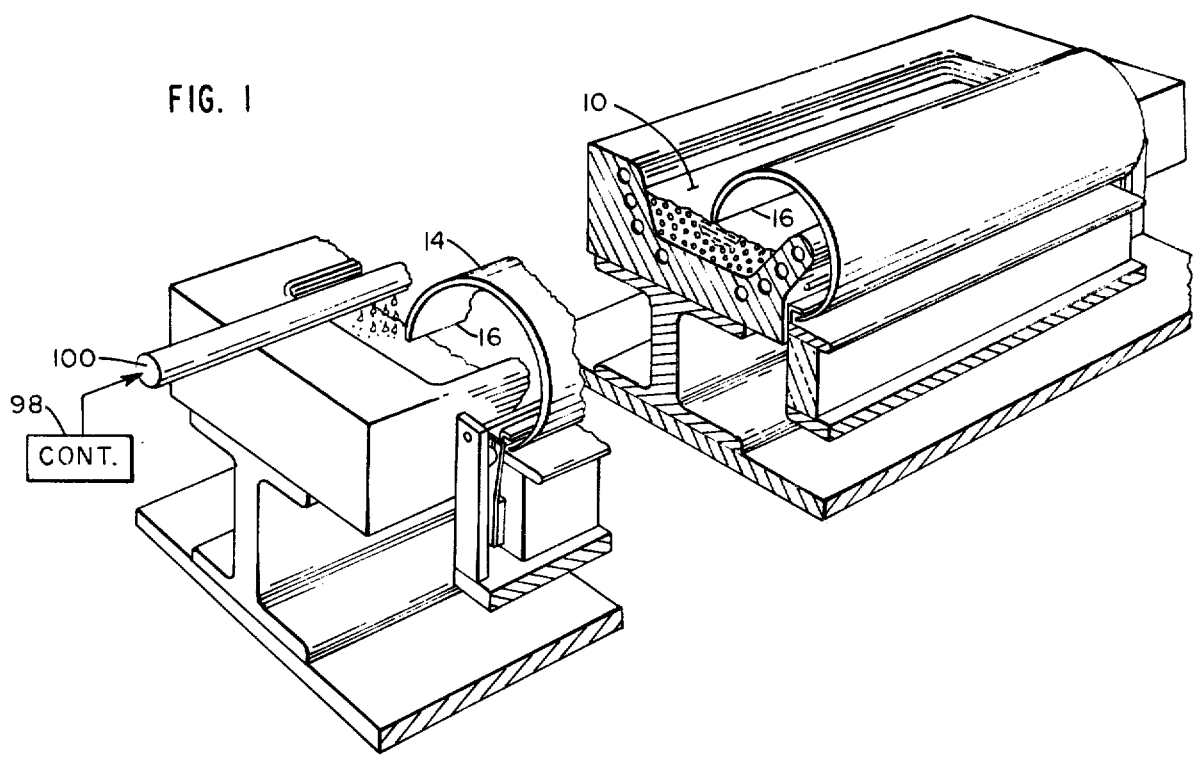
FIG. 1 is a pictorial, partially broken away view of an evaporator system incorporating the invention.
Figure 2:
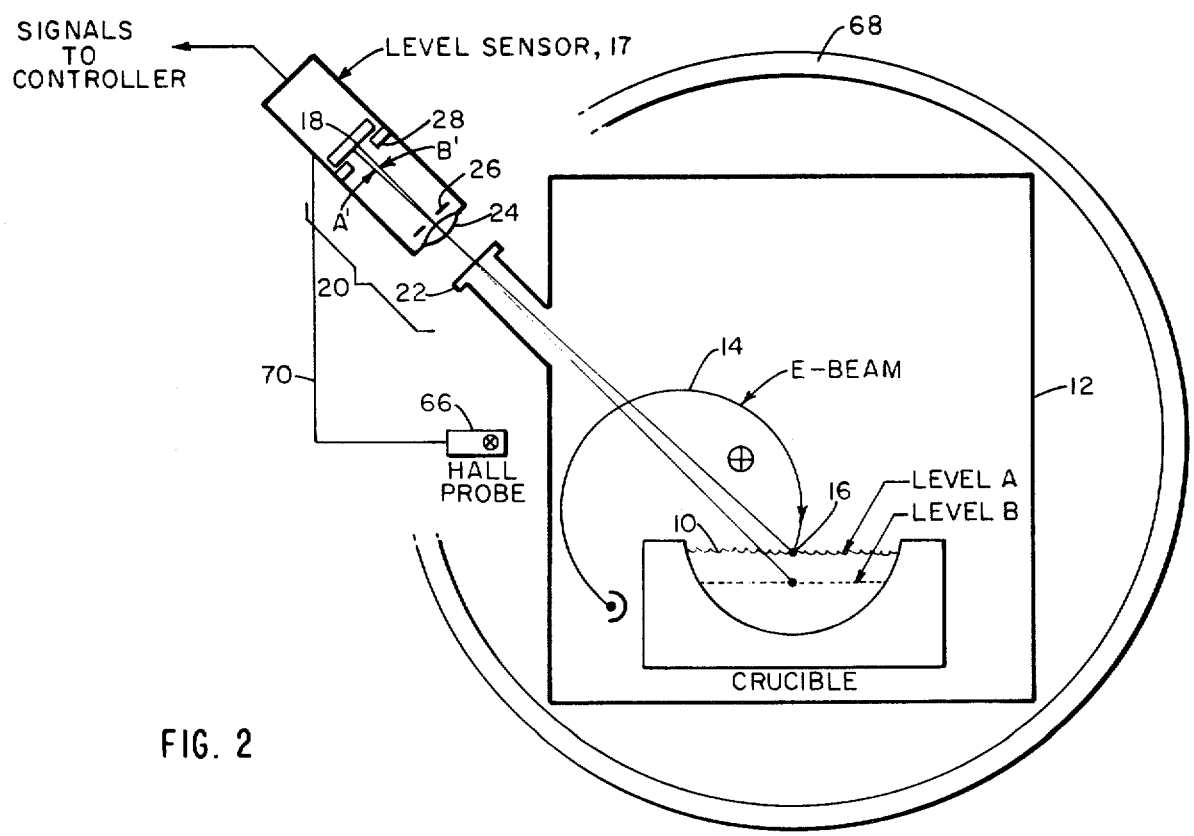
FIG. 2 is a diagrammatic end view of an evaporator system incorporating the present invention.

An evaporator incorporating the present invention is shown in FIGS. 1 & 2. A pool 10 of material to be evaporated is located inside a vacuum chamber 12. A beam 14 of electrons impinges on the surface of the pool 10 transferring energy to the material of the pool, heating and evaporating the material. The region 16 of the pool surface which the electron beam impacts emits light. Region 16 is typically a line for the present application but may be a point source as well. In order to monitor the level of the pool 10, light from the region 16 is imaged by a level sensor 17 on a position sensitive photodetector 18 by an optical system 20. The detector 18 and optical system 20 are positioned such that a change in pool level results in a change in the position of the detector 18.

The optical system 20 includes a viewport 22 into the vacuum chamber 12, a lens 24, an adjustable iris 26, and a mask 28, placed over the detector 18. The viewport 22 is provided so that the level sensor 17 can be located outside of the vacuum chamber 12 and is placed on an extension pipe to remove it from the vapor containing environment. The lens 24 focuses an image of the region 16 of the pool surface impacted by the electron beam 14 onto the detector 18. The mask 28 placed over the detector 18 limits the field of view of the detector and reduces stray background illumination. A narrowband optical filter, having a transmissivity centered at the peak of the spectral emission of the light from the surface region 16 may be used, optionally, immediately before the lens 24 to provide further discrimination, although in typical application this has been found to be unnecessary. An iris 26 placed immediately behind the lens 24 is used to adjust the overall light level at the detector 18.

FIG. 2, illustrates the geometry of the level measurement. When the pool is at a first level A, representing a typically full crucible, the light from spot 16 will be imaged along line A' on the detector 18. If the pool falls to a level B representing a typical minimum fill level, the image will move on the detector 18 along a line B'. The shift in position will generate a change in output signal from detector 18 which can be processed to reflect the level change as described below with respect to FIG. 3.

Figure 3:
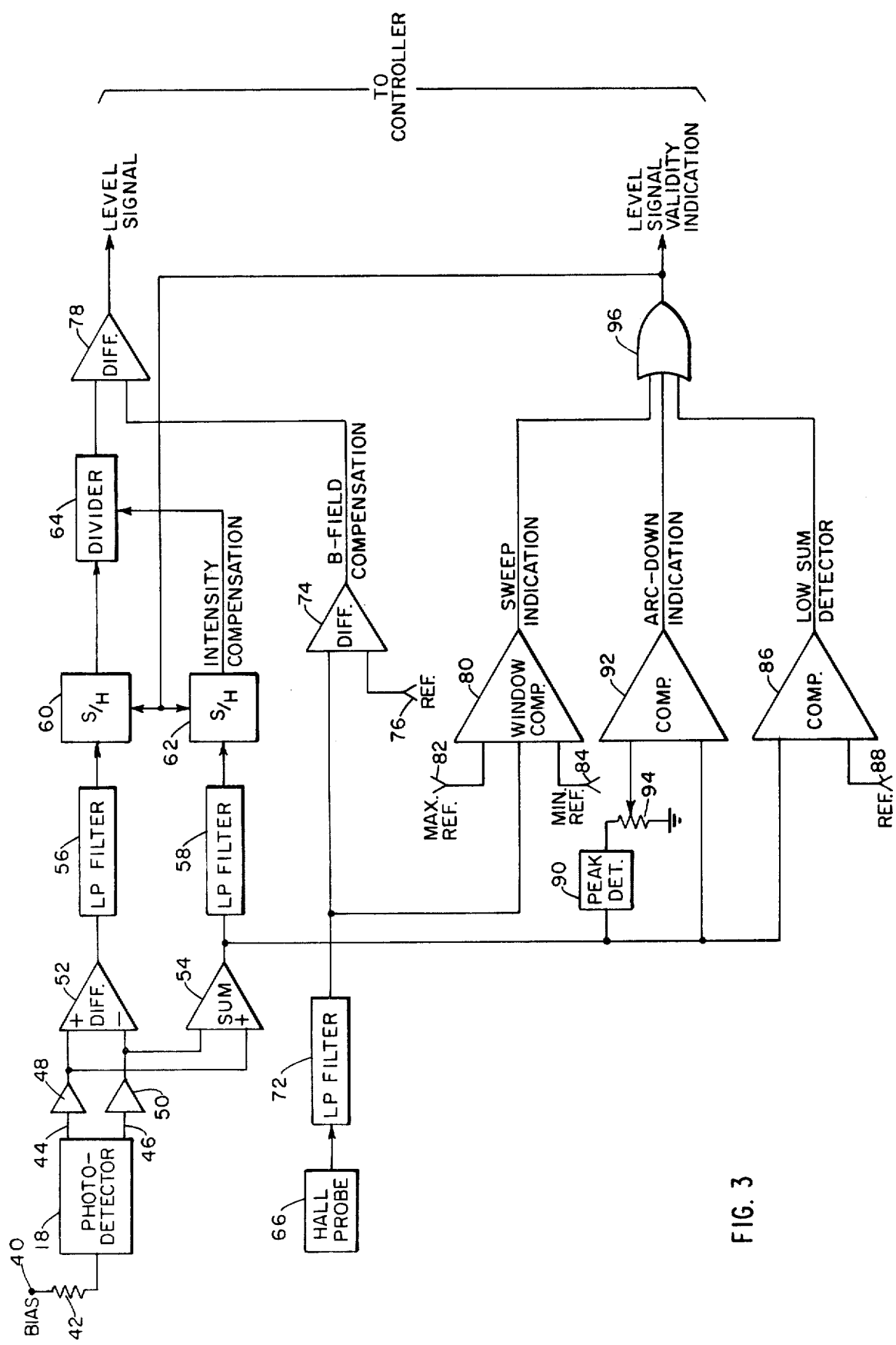
FIG. 3 is a schematic diagram of processing circuitry for the photodetector signal provided in FIG. 2.

FIG. 3 is a block and schematic diagram of the electrical signal processing of the level sensor 17. The detector 18 is typically a single axis silicon, lateral photo-effect device. A suitable detector is a model PIN-LSC/5D, obtainable from United Detector Technology, Culver City, Calif. A voltage source 40 applies a bias through a resistor 42 to one terminal of the detector 18. Current outputs from the detector 18 are provided at two other terminals 44 and 46. These output currents reflect both the displacement from center of the centroid of illumination on the detector 18 surface, and the total illumination intensity of light imaged on the detector 18.

Amplifiers 48 and 50 amplify and convert these current signals to voltage signals. A differential amplifier 52 responds on differential inputs to the outputs of amplifiers 48 and 50 to produce a voltage proportional to both image spot position and intensity. A summing amplifier 54 responds to the outputs of amplifiers 48 and 50 on summing inputs to produce a voltage proportional only to image spot intensity on detector 18. The difference and sum output signals are applied through low-pass filters 56 and 58 respectively with very low frequency cutoffs to remove higher frequency components caused by waves on the pool surface. These filters each have a single pole at about 0.1 Hertz. The signals from filters 56 and 58 are applied to sample-and-hold circuits 60 and 62 respectively which in the normal mode pass the signals from the filters 56 and 58. The filtered difference signal from the sample and hold circuit 60 is applied to the numerator input of an analog divider 64 for division by the filtered sum signal applied from the sample and hold circuit 62 to the denominator input of divider 64. The output of divider 64 is an intensity-corrected position signal; a signal proportional to spot 16 position and independent of intensity of light imaged from spot 16.

In an electron beam evaporator, variations in the strength of an applied magnetic field will deflect the electron beam moving the position of spot 16 laterally on the pool surface. These beam movements, which are sometimes intentionally induced, will cause movements of the image on the detector 18. The present invention recognizes this source of error and corrects the position signal so that these beam movements are not misinterpreted as changes in pool level. A deflection correction signal proportional to deviations in strength of the magnetic field is generated either by monitoring the current in the coils which generate the magnetic field, or by measuring the magnetic field strength directly. In the embodiment of FIG. 3, a Hall generator is used to measure the strength of the deflecting magnetic field produced by a set of coils 68 around the chamber 12. A suitable Hall generator is a model BH-705 available from F. W. Bell, Inc., Orlando, Fla. The Hall generator is biased with a constant current and its output is amplified and temperature compensated to produce a voltage signal proportional to the strength of the magnetic field at the Hall generator. Circuits for using a Hall generator to produce such a temperature stabilized voltage signal are well known. As shown in FIGS. 2 & 3, the Hall generator and associated amplifier constitute the Hall probe 66 which is connected to the rest of the level sensor apparatus via a length of cable 70. Because the deflection coils surround the entire vacuum chamber, the Hall probe 66 can be positioned outside the chamber 12 and still accurately measure the magnetic field. The output of the Hall probe 66 is applied to a low-pass filter 72 (a single pole at about 0.1 Hertz). The output of filter 72 is applied to a differential amplifier 74 on a noninverting input while a constant reference signal from a source 76 is applied to an inverting input. The reference source 76 is selected at a level corresponding to a magnetic field which would position the electron beam in the center of the pool and results in a zero-level signal output from amplifier 76 under normal conditions. The output of amplifier 74 which represents deviations of the electron beam from its normal position, is applied to the inverting input of a differential amplifier 78. The noninverting input of amplifier 78 receives the output of divider 64. Amplifier 78 provides an output indicative of the level of the pool corrected for both light intensity variation and electron beam deviations.

The apparatus of the present invention detects conditions under which pool level cannot be reliably measured. These include large deviations in beam 14 position, excessively low light level at the detector 18, and brief loss of the electron beam 14. The present invention operates to detect one or more of these conditions and apply a signal to the sample-and-hold circuits 60 and 62 causing them to hold the filtered sum and difference signals constant until after the detected conditions have disappeared.

In order to heat the entire pool evenly, the electron beam may be scanned across the surface of the pool. The large deviations in beam position which occur during such scanning may be larger than can be accurately compensated for by the above-described deflection-correction circuitry. This beam scanning condition is detected by applying the filtered magnetic field signal from filter 72 to a window comparator 80. The digital output of the window comparator indicates when the magnetic field signal is outside a predetermined range represented by maximum and minimum reference voltages from sources 82 and 84.

For various reasons, such as gradual coating of the viewport window 22, the intensity of the image on the detector 18 may diminish over time. As the intensity approaches very low levels, the divider 64 will divide by a low number creating large error potential. The sum signal from amplifier 54, which is indicative of the intensity imaged on detector 18, is applied to a comparator 86 for comparison to a predetermined reference level from a source 88 below which pool level measurement is considered unreliable. A digital output of comparator 86 indicates when there is an insufficient sum signal and thus too low an intensity.

Occasional electron beam arc-downs may occur during the use of an electron beam evaporator. In these events the beam is shut down for times typically less than one second. The light radiated by spot 16 under these conditions is not as concentrated in the region of beam impact as when the beam is active and resulting level measurement is unreliable. During such arc-downs the pool is still hot enough to produce a total light signal above that which would indicate that the light intensity is too low and thus the circuitry described in the previous paragraph may not successfully detect this condition. An arc-down is detected by applying the sum signal from amplifier 54 (proportional to total light intensity) to a peak detector 90 having a time constant of about 10 seconds and to a comparator 92. The output of peak detector 90 is attenuated (gain of about 0.75) in a potentiometer 94 and applied to the comparison input of comparitor 92. When the total light intensity suddenly drops below 75% of its previous intensity a digital signal is provided by the output of comparator 92 indicating that an arc-down condition exists.

The outputs of the comparators 80, 86, and 92 are applied through a nonexclusive OR gate 96 to activate the sample and hold circuits 60 and 62 so that their input signal levels prior to detection of one these conditions is maintained until the condition is corrected. In this manner, potentially false level indications at the output of amplifier 78 are avoided.

The level sensor 17 is preferably mounted on a rotation stage. This allows the level sensor to be positioned such that the normal pool level yields a zero output from the level sensor 17. With a fixed level sensor, setting of the reference level is accomplished by providing an adjustable electrical offset in the level sensor circuitry.

The evaporator system of FIG. 2 typically includes an automatic level controller 98. Controller 98 functions to extend a feed stock 100 into the skip field of the electron beam 14 to melt feed material into the pool 10 with the result of maintaining the level of the molten pool 10 of material within a predetermined range. The level sensor 17 of FIG. 3 provides two signals to the level controller. The first is the analog signal from amplifier 78 indicating the difference between the level of the pool 10 and a desired reference level. The second signal is the digital indication from OR gate 96 of whether the analog level signal is reliable and following the pool level, or whether the analog level signal is being held constant due to the detection of one of the three conditions described above. Controller 98 operates to replenish pool 10 from feed stock 100 when the indicated level drops below the desired level. Presence of a signal from gate 96 may be used with external logic to inhibit controller 98 after a suitable delay time to allow the fault condition to clear.

The above described embodiment is exemplary only. The actual scope of the invention is reflected solely in the following claims.

What is claimed is:

1. Apparatus for measuring the level of a molten metal pool in an electron beam evaporator comprising:
    means for evaporating a material from a localized surface region having evaporating energy applied thereto, to produce evaporation of the material therefrom and emission of energy therefrom;
    the position of said surface region moving with the evaporation of said material;
    means remote from said surface region and responsive to the energy emitted from said surface region for detecting the position of said surface region.

2. The apparatus of claim 1 wherein said detector means further comprises:
    means responsive to energy incident on a surface for providing an output signal indicative of the position of incidence of energy on the surface of said detector means; and
    means for imaging said energy emitting surface region onto the surface of said detector means, whereby the change of position of said surface region with evaporation, results in a change in the position of incidence of emitted energy on the surface of said detector means.

3. The apparatus of claim 2 wherein said detector means includes:
    means for providing a first signal representative of emitted energy intensity incident toward a first edge of said detector surface;
    means for providing a second signal representative of emitted energy intensity incident toward a second opposite edge of said detector surface;
    means responsive to said first and second signals for indicating their difference; and
    means responsive to said first and second signals for adjusting the indicated difference as a function of the combined intensities of said first and second signals thereby to remove sensitivity to absolute signal intensity in said indicated difference;
    the adjusted indicated difference providing said output signal.

4. The apparatus of claims 2 or 3 wherein the emitted energy is light.

5. The apparatus of claim 2 or 3 wherein said imaging means includes a focusing optical system.

6. The apparatus of claims 1, 2, or 3 wherein said evaporating means includes a linear electron beam evaporator.

7. The apparatus of claim 2 wherein said detector means further includes:
    means for providing an output signal representative of both the intensity and position of emitted energy incident on the surface of said detector means; and
    means for reducing the sensitivity of said output signal to the intensity of energy incident on said surface, whereby said output signal represents the position of said surface region.

8. The apparatus of claim 1 further comprising:
    means for evaporating said material by an electron beam;
    means for deflecting the electron beam by a magnetic field;
    means for producing a signal related to the magnitude of the magnetic field which is used to deflect the electron beam; and
    means for compensating the signal from the detector means for changes in magnitude of the deflecting magnetic field, thereby to reduce the sensitivity of the position signal to changes in the magnitude of the magnetic field.

9. The apparatus of claim 8 further including:
    means for sensing at least one condition indicative of unreliable level measurement selected from the group consisting of:
        low emitted energy intensity,
        absence of the electron beam arc-down, and
        deflection of the electron beam outside a predetermined deflection range; and
    means responsive to sensing of any one of said conditions, for holding constant the detected position at the position detected prior to sensing of the condition.

10. Apparatus for monitoring the position of a localized surface region of material being evaporated comprising:
   means for evaporating material from a localized surface region thereof;
   detector means including a surface onto which radiation can be imaged for producing a signal related to the position of radiation on the surface of said detector means; and
   means for imaging radiation emitted from the localized surface region of said material onto the surface of said detector means.

11. The apparatus of claim 10 further including means for reducing the sensitivity of the position signal of the detector means to changes in intensity of the energy imaged on the surface of the detector means.

12. The apparatus of claim 10 further comprising:
   means for evaporating said material by an electron beam;
   means for deflecting the electron beam by a magnetic field;
   means for producing a signal related to the magnitude of the magnetic field which is used to deflect the electron beam; and
   means for compensating the signal from the detector means for changes in magnitude of the deflecting magnetic field, thereby to reduce the sensitivity of the position signal to changes in the magnitude of the magnetic field.

13. The apparatus of claim 12 further including:
   means for sensing at least one condition indicative of unreliable position monitoring selected from the group consisting of:
   low imaged radiation intensity,
   absence of the electron beam, and
   deflection of the electron beam outside a predetermined deflection range; and
   means responsive to sensing of any one of said conditions, for holding constant the position signal at the position signal produced prior to sensing of the condition.

* * * * *